United States Patent
Zhang

(10) Patent No.: US 10,314,172 B2
(45) Date of Patent: Jun. 4, 2019

(54) FLEXIBLE SUBSTRATE AND DISPLAY DEVICE

(71) Applicant: BOE TECHNOLOGY GROUP CO., LTD., Beijing (CN)

(72) Inventor: Bo Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/325,416

(22) PCT Filed: Feb. 18, 2016

(86) PCT No.: PCT/CN2016/074017
§ 371 (c)(1),
(2) Date: Jan. 10, 2017

(87) PCT Pub. No.: WO2017/045358
PCT Pub. Date: Mar. 23, 2017

(65) Prior Publication Data
US 2017/0295649 A1    Oct. 12, 2017

(30) Foreign Application Priority Data

Sep. 18, 2015   (CN) .................... 2015 2 0730033 U

(51) Int. Cl.
*G09F 9/30*   (2006.01)
*H05K 1/18*   (2006.01)
(Continued)

(52) U.S. Cl.
CPC .............. *H05K 1/189* (2013.01); *G09F 9/30* (2013.01); *H05K 1/118* (2013.01); *H05K 1/028* (2013.01)

(58) Field of Classification Search
USPC ................................. 361/749, 748
See application file for complete search history.

(56) References Cited

U.S. PATENT DOCUMENTS 6,600,222 B1   7/2003   Levardo
7,154,175 B2 *  12/2006  Shrivastava ........ H01L 23/4985
                                                        257/723

(Continued)

FOREIGN PATENT DOCUMENTS

CN        1669140 A     9/2005
CN      102867786 A     1/2013
(Continued)

OTHER PUBLICATIONS

International Search Report and Written Opinion in PCT/CN2016/074017 dated Jun. 23, 2016, with English translation. 16 pages.

*Primary Examiner* — Andargie M Aychillhum
(74) *Attorney, Agent, or Firm* — Womble Bond Dickinson (US) LLP

(57) ABSTRACT

A flexible substrate and a display device are provided. The flexible substrate comprises at least two chip regions in which functional chips are arranged. A bendable region is arranged between two adjacent chip regions, the flexible substrate is bended at the bendable region, and two chip regions adjacent with the bendable region overlap. According to the present disclosure, the flexible substrate can be bended in the bendable region, so that chip regions on both sides of the bendable region overlap, thus decreasing the space occupied by the flexible substrate.

18 Claims, 5 Drawing Sheets

(51) Int. Cl.
*H05K 1/11* (2006.01)
*H05K 1/02* (2006.01)

(56) References Cited

U.S. PATENT DOCUMENTS

2007/0205479 A1   9/2007  Dangel et al.
2007/0212919 A1*  9/2007  Clayton ............... H01L 23/473
                                              439/326
2017/0299369 A1* 10/2017  McNab .................... G01B 7/18

FOREIGN PATENT DOCUMENTS

| CN | 103400809 A | 11/2013 |
| CN | 204948505 U |  1/2016 |

* cited by examiner

FLEXIBLE SUBSTRATE AND DISPLAY DEVICE

RELATED APPLICATIONS

The present application is the U.S. national phase entry of PCT/CN2016/074017, with an international filing date of Feb. 18, 2016, which claims the benefit of Chinese Patent Application No. 201520730033.1, filed on Sep. 18, 2015, the entire disclosures of which are incorporated herein by reference.

TECHNICAL FIELD

The present disclosure relates to the field of flat panel display technique, and particularly to a flexible substrate and a display device.

BACKGROUND

With recent development in the microelectronic technique, electronic products are developing with a trend of miniaturization, light in weight, and easy to carry. COF (Chip On Flex, or Chip On Film) is a technique in which IC (integrated circuit) chips are fixed to a flexible substrate, and an additional flexible substrate is used as a carrier for encapsulating IC chips, so as to connect IC chips with circuits on the flexible substrate. COF can to an extent solve the problem of space occupation.

SUMMARY

The existing COF only mounts IC chips on the flexible substrate through an ACF (anisotropic conductive film). The flexible substrate can change its shape with an external force. However, due to hardness of the encapsulated IC chips, the flexible substrate changes its shape in a limited range, so that the problem of space occupation cannot be solved more effectively. Besides, in COF, the flexible substrate is connected with the hard circuit board on which a peripheral circuit assembly is installed, to form an integrated flex-rigid board. The rigid circuit board has a large volume and weight and is not flexible, and thus occupies large space in the display module. This is not fit for the developing trend of light and small encapsulation of the display module.

An embodiment of the present disclosure provides a flexible substrate, wherein the flexible substrate comprises at least two chip regions in which functional chips are arranged; and a bendable region is arranged between two adjacent chip regions, the flexible substrate is bended at the bendable region, and two chip regions adjacent with the bendable region overlap.

In the present embodiment, the flexible substrate comprises the bendable region, and can be bended in the bendable region, so that the chip regions at both sides of the bendable region overlap, thus decreasing space occupied by the flexible substrate.

For example, the chip regions are further provided with electrodes to be electrically connected with an external substrate.

For example, the flexible substrate comprises wires which are arranged in the bendable region, and the functional chips are connected with one another through the wires.

For example, the flexible substrate in the bended state has a cross-sectional shape of a wave, a square wave, or a rectangular spiral. In the present embodiment, the flexible substrate can be bended into various shapes as needed during assembling.

For example, the chip regions have a same shape and a same size.

For example, the flexible substrate is only provided with the functional chips on a side of the chip regions, and the functional chips are arranged on different sides of the two adjacent chip regions. In the present embodiment, the encapsulating surface of the functional chips can be designed by taking bending requirements of the flexible substrate into account.

For example, in an extending direction of the flexible substrate, the bendable region has a width which is at least equal to or larger than the largest thickness of the functional chips in the two adjacent chip regions. In the present embodiment, the bendable region having a width at least equal to or larger than the thickness of the functional chip with the largest thickness can ensure that, in a bended state of the flexible substrate "in which the functional chips are arranged on different sides of two adjacent chip regions", two adjacent chip regions can overlap, without affecting the functional chips in the chip regions.

For example, the flexible substrate is only provided with the functional chips on a side of the chip regions, and the functional chips are arranged on a same side of the two adjacent chip regions. In the present embodiment, the encapsulating surface of the functional chips can be designed by taking bending requirements of the flexible substrate into account.

For example, the flexible substrate is provided with the functional chips on both sides of the chip regions. In the present embodiment, the encapsulating surface of the functional chips can be designed by taking bending requirements of the flexible substrate into account.

For example, in an extending direction of the flexible substrate, the bendable region has a width which is at least two or more times the largest thickness of the functional chips in the two adjacent chip regions. In the present embodiment, the bendable region having a width at least two or more times the thickness of the functional chip with the largest thickness can ensure that, in a bended state of the flexible substrate "in which the functional chips are arranged on a same side or both sides of two adjacent chip regions", two adjacent chip regions can overlap, without affecting the functional chips in the chip regions.

For example, the functional chips comprise one or more chip constructed into a single chip, a stacked chip, or a TSV (Through Silicon Via) integrated chip. In the present embodiment, the functional chips can be a single chip, for example, a capacitor, a resistor, a diode, and an inductor. The functional chips can also be an IC chips, for example, a gate driver chip, a data driver chip, and a SCM (single chip microcomputer). Further, the functional chips can be a TSV chip.

An embodiment of the present disclosure further provides a display device. The display device comprises a peripheral circuit which is encapsulated in the flexible substrate of the above embodiments.

DETAILED DESCRIPTION OF EMBODIMENTS

The specific embodiments of the present disclosure shall be further described in the following text with reference to the figures and the embodiments. The following embodiments are only used for explaining more clearly the technical solution of the present disclosure rather than limiting the protection scope of the present disclosure.

The present disclosure provides a flexible substrate and a display device. For example, the present disclosure can solve the problem in which the flexible substrate is limited in the magnitude of changing shape due to the hardness of the encapsulated IC chips, and space occupation cannot be solved more effectively. For example, the present disclosure can further solve the problem in which the rigid circuit board occupies large space when the flexible substrate is connected with the rigid circuit board to form an integrated flex-rigid board.

Figure 1:
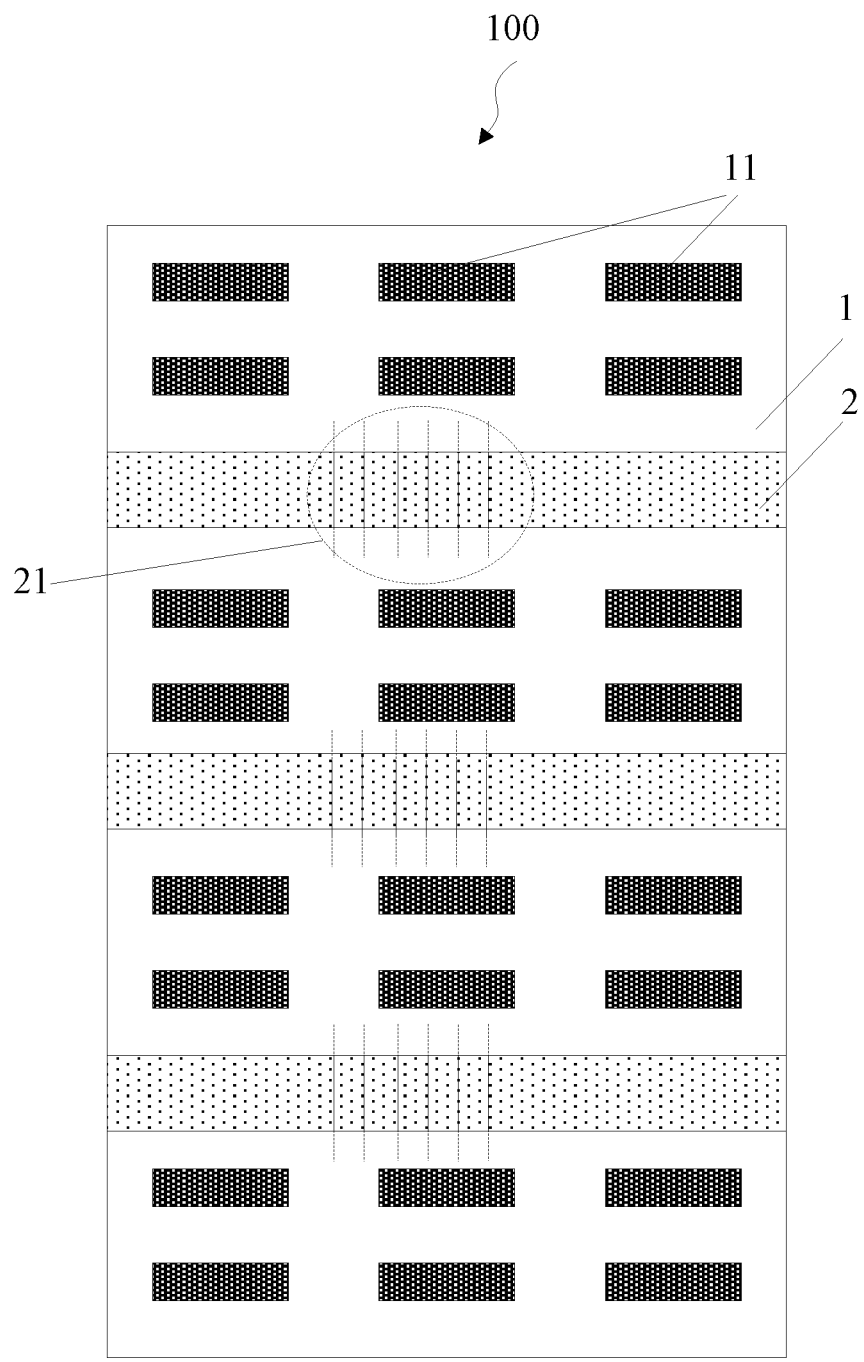
FIG. 1 is a top view illustrating a flexible substrate in an embodiment of the present disclosure.

As shown in FIG. 1, an embodiment of the present disclosure provides a flexible substrate 100. The flexible substrate 100 comprises at least two chip regions 1, and functional chips 11 and electrodes to be electrically connected with an external substrate are arranged in the chip regions 1. A bendable region 2 is arranged between two adjacent chip regions 1. The functional chips 11 are connected with one another through wires 21 which are arranged in the bendable region 2. The flexible substrate 100 is bended in the bendable region 2. In the bended state, two chip regions 1 adjacent with the bendable region 2 overlap.

In the present embodiment, the flexible substrate 100 comprises the bendable region 2. The flexible substrate 100 can be bended in the bendable region 2, so that chip regions 1 at both sides of the bendable region 2 overlap, thus decreasing the space occupied by the flexible substrate 100.

Figure 2:
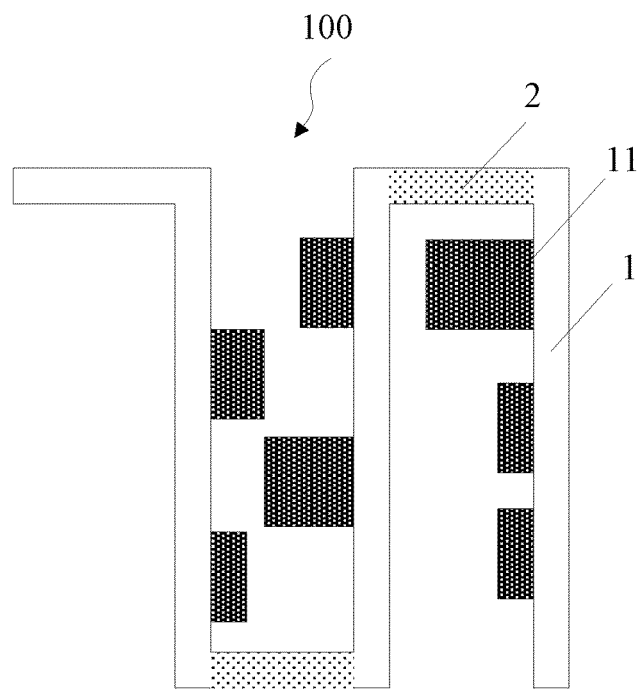
FIG. 2 is a schematic view illustrating a first shape of a flexible substrate in a bended state in an embodiment of the present disclosure.
Figure 3:
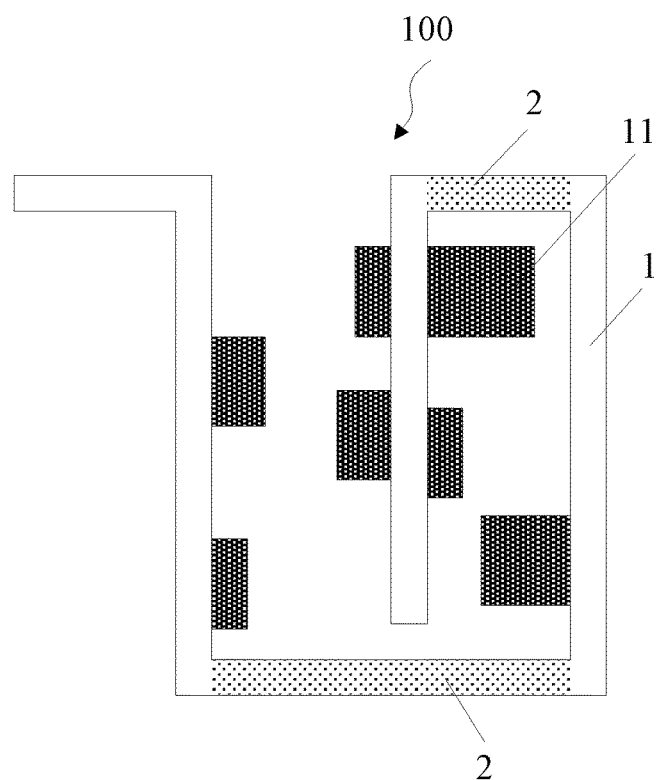
FIG. 3 is a schematic view illustrating a second shape of a flexible substrate in a bended state in an embodiment of the present disclosure.

After the flexible substrate 100 is bended in the bendable region 2, the flexible substrate 100 in the bended state has a cross-sectional shape of a wave, a square wave, or a rectangular spiral. For example, as shown in FIG. 2, the flexible substrate 100 in the bended state has a square wave in the cross-section. In another example, as shown in FIG. 3, the flexible substrate 100 in the bended state has a rectangular spiral in the cross-section. In the present embodiment, the flexible substrate 100 can be bended into various shapes as needed during assembling.

For example, the chip regions 1 have a same shape and a same size, so that the flexible substrate 100 in the bended state has a regular shape, which facilitates decreasing the occupied space.

It is noted that, functional chips 11 can be arranged on any side or both sides of the chip regions 1, which will be described in detail hereinafter.

Figure 4:
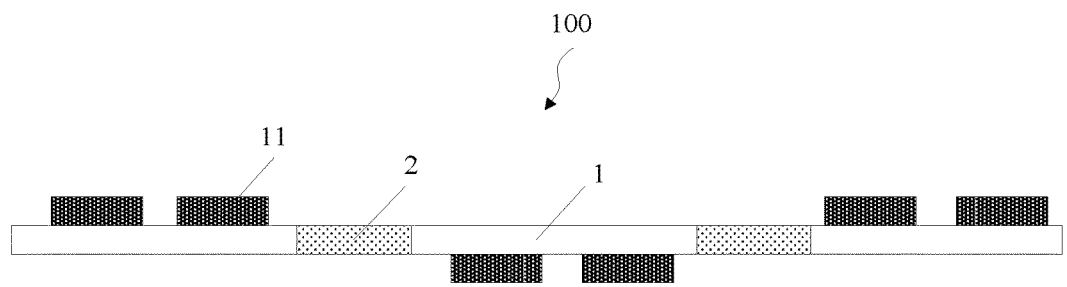
FIG. 4 is a partially cross-sectional view illustrating a first flexible substrate in an embodiment of the present disclosure.
Figure 5:
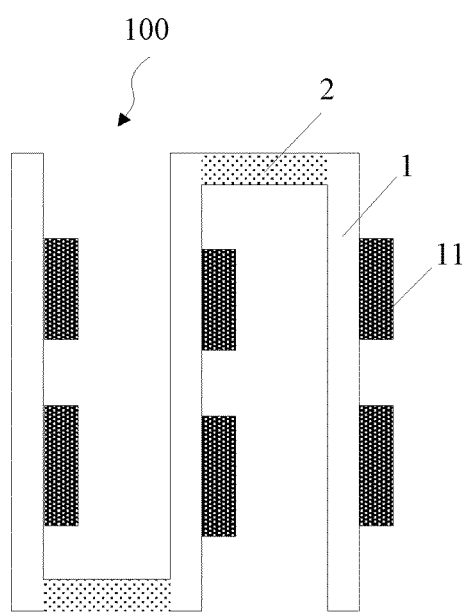
FIG. 5 is a cross-sectional view illustrating the first flexible substrate shown in FIG. 4 in a bended state.

For example, as shown in FIG. 4, the flexible substrate 100 can be provided with functional chips 11 on only one side of the chip regions 1, and functional chips 11 are arranged on different sides of two adjacent chip regions 1. The flexible substrate 100 shown in FIG. 4, when bended in the bendable region 2, has a shape shown in FIG. 5. Of course, the bending manner shown in FIG. 5 is merely illustrative in nature, and the present disclosure is not limited thereto. The width of the bendable region 2 can be designed in the following manner, so as to ensure that "functional chips 11 are arranged on different sides of two adjacent chip regions 1", and that in the bended state of the flexible substrate 100, two adjacent chip regions 1 can overlap without affecting functional chips 11 in the chip regions 1. In an extending direction of the flexible substrate 100 (for example, a horizontal direction in FIG. 4), the width of the bendable region 2 is at least equal to or larger than the largest thickness for functional chips 11 in two adjacent chip regions 1.

Figure 6:
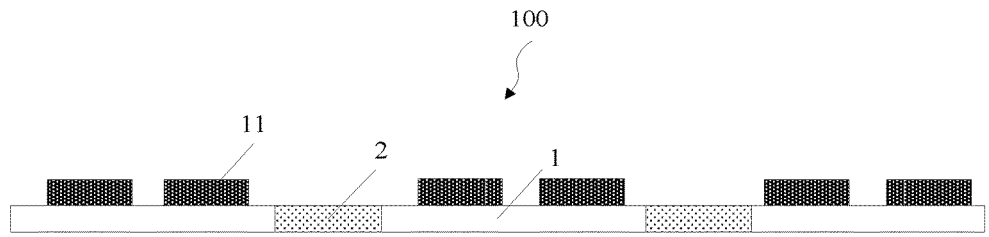
FIG. 6 is a partially cross-sectional view illustrating a second flexible substrate in an embodiment of the present disclosure.
Figure 7:
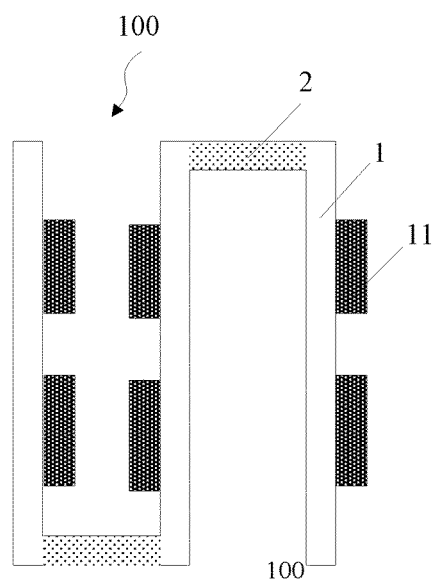
FIG. 7 is a cross-sectional view illustrating the second flexible substrate shown in FIG. 6 in a bended state.

For example, as shown in FIG. 6, the flexible substrate 100 is only provided with functional chips 11 on one side of the chip regions 1, and functional chips 11 are arranged on a same side of the two adjacent chip regions 1. Namely, all functional chips 11 are arranged on a same side of the flexible substrate 100. The flexible substrate 100 shown in FIG. 6, when bended in the bendable region 2, has a shape shown in FIG. 7. Of course, the bending manner shown in FIG. 7 is merely illustrative in nature, and the present disclosure is not limited thereto. The width of the bendable region 2 can be designed in the following manner, so as to ensure that "functional chips 11 are arranged on a same side of two adjacent chip regions 1", and that in the bended state of the flexible substrate 100, two adjacent chip regions 1 can overlap without affecting functional chips 11 in the chip regions 1. In an extending direction of the flexible substrate 100 (for example, a horizontal direction in FIG. 6), the width of the bendable region 2 is at least two or more times the largest thickness for functional chips 11 in two adjacent chip regions 1.

Figure 8:
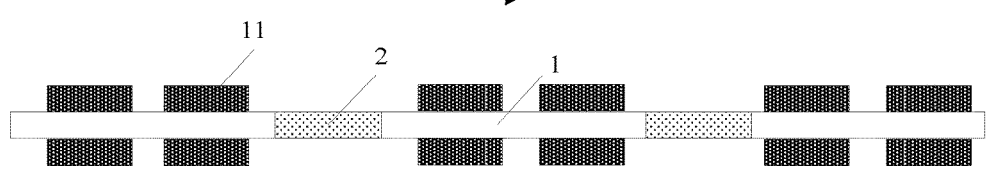
FIG. 8 is a partially cross-sectional view illustrating a third flexible substrate in an embodiment of the present disclosure.
Figure 9:
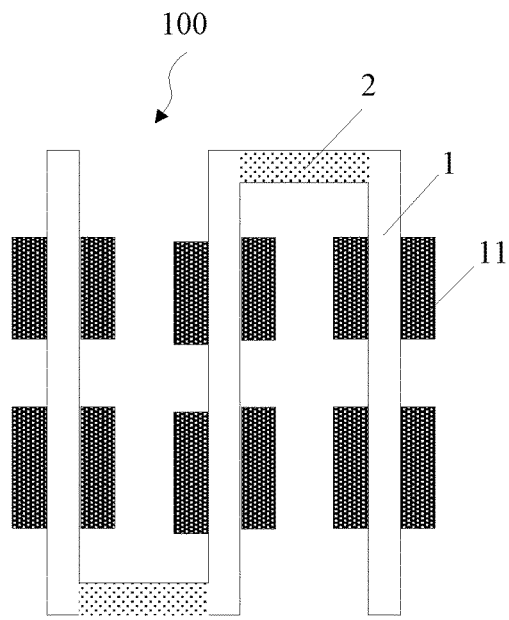
FIG. 9 is a cross-sectional view illustrating the third flexible substrate shown in FIG. 8 in a bended state.

For example, as shown in FIG. 8, the flexible substrate 100 is provided with functional chips 11 on both sides of chip regions 1. The flexible substrate 100 shown in FIG. 8, when bended in the bendable region 2, has a shape shown in FIG. 9. The width of the bendable region 2 can be designed in the following manner, so as to ensure that "functional chips 11 are arranged on both sides of two adjacent chip regions 1", and that in the bended state of the flexible substrate 100, two adjacent chip regions 1 can overlap without affecting functional chips 11 in the chip regions 1. In an extending direction of the flexible substrate 100, the width of the bendable region 2 is at least two or more times the largest thickness for functional chips 11 in two adjacent chip regions 1.

For example, the functional chips 11 comprise one or more chip constructed into a single chip, a stacked chip, or a TSV integrated chip. In the present embodiment, the functional chips 11 can be a single chip, for example, a capacitor, a resistor, a diode, and an inductor. The functional chips 11 can also be an IC chips, for example, a gate driver chip, a data driver chip, and a SCM (single chip microcomputer). Further, the functional chips 11 can be a TSV chip.

As for different types of functional chips 11, different encapsulating methods can be used. For example, in case the functional chips 11 are chips with a number of dense pins, such as a gate driver chip, a data driver chip, or a SCM, the functional chips 11 can be encapsulated by Micro Bump to be directly electrically and mechanically connected with the flexible substrate 100, and under-filling is provided for protection. For example, in case the functional chips 11 are chips or elements with pins of a less number, the functional chips 11 can be encapsulated by BGA (Ball Grid Array), in which the functional chips and the flexible substrate 100 are electrically and mechanically connected by solder balls. For example, when the functional chips 11 are elements like a capacitor, a resistor, or an interface device, the functional chips 11 can be encapsulated by SMT (Surface Mount Technology), in which the functional chips are mounted on, and thus electrically and mechanically connected with the flexible substrate 100.

It is noted that, the flexible substrate 100 can further comprise some common interfaces, like a power supply interface, a data line interface. These interfaces can be arranged at a periphery of the flexible substrate 100, which facilitates connections with external lines after encapsulation to save space.

Embodiments of the present disclosure provide the following beneficial effects. The flexible substrate comprises the bendable region, the flexible substrate can be bended in the bendable region, so that the chip regions at both sides of the bendable region overlap, thus decreasing space occupied by the flexible substrate.

Figure 10:
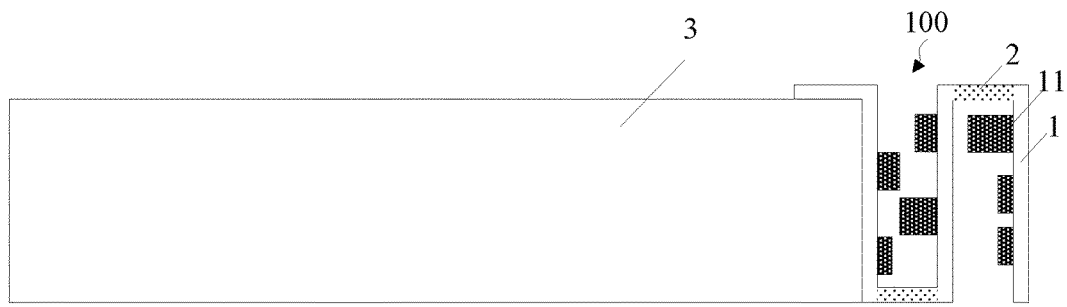
FIG. 10 is a schematic view illustrating connections between a display module and a flexible substrate in an embodiment of a display device of the present disclosure.

As shown in FIG. 10, an embodiment of the present disclosure further provides a display device. The display device comprises a peripheral circuit which is encapsulated in the flexible substrate 100 of the above embodiments.

The peripheral circuit on a rigid circuit board in the prior art can be encapsulated in the flexible substrate 100 of the above embodiments. The peripheral circuit can be a driving circuit, a control circuit, or a power supply circuit comprising several IC chips, which are not described here for simplicity. The flexible substrate 100 can be connected with a display panel of the display device in the following manner. An end of the flexible substrate 100 is electrically and mechanically connected with a display module 3 of the display panel via TAB (Tape Automated Bonding), and under-filling is performed for protection. The flexible substrate 100 is bended along an edge of the display module 3 and attached to a side edge of the display module 3.

It is noted that, the display module 3 can be a combination of a glass substrate and a backlight module of the liquid crystal display panel, and can also be a glass substrate of an electroluminescent display panel, which are not described here for simplicity.

Embodiments of the present disclosure provide the following beneficial effects. The flexible substrate comprises the bendable region, the flexible substrate can be bended in the bendable region, so that the chip regions at both sides of the bendable region overlap, thus decreasing space occupied by the flexible substrate. In addition, since the peripheral circuit is encapsulated in the flexible substrate, there is no need for a rigid circuit board, which can effectively save space.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A flexible substrate, comprising:
   at least two chip regions in which functional chips are arranged; and
   a bendable region which is arranged between two adjacent chip regions,
   wherein the flexible substrate is configured to be bended at the bendable region, and
   wherein in the bended state of the flexible substrate, two chip regions adjacent with the bendable region overlap, and the flexible substrate has a cross-sectional shape of a rectangular spiral.

2. The flexible substrate of claim 1, wherein the chip regions are further provided with electrodes to be electrically connected with an external substrate.

3. The flexible substrate of claim 1, wherein the flexible substrate comprises wires which are arranged in the bendable region, and the functional chips are connected with one another through the wires.

4. The flexible substrate of claim 1, wherein the chip regions have a same shape and a same size.

5. The flexible substrate of claim 1, wherein the flexible substrate is only provided with the functional chips on a side of the chip regions, and the functional chips are arranged on different sides of the two adjacent chip regions.

6. The flexible substrate of claim 5, wherein in an extending direction of the flexible substrate, the bendable region has a width which is at least equal to or larger than the largest thickness of the functional chips in the two adjacent chip regions.

7. The flexible substrate of claim 1, wherein the flexible substrate is only provided with the functional chips on a side of the chip regions, and the functional chips are arranged on a same side of the two adjacent chip regions.

8. The flexible substrate of claim 7, wherein in an extending direction of the flexible substrate, the bendable region has a width which is at least two or more times the largest thickness of the functional chips in the two adjacent chip regions.

9. The flexible substrate of claim 1, wherein the flexible substrate is provided with the functional chips on both sides of the chip regions.

10. The flexible substrate of claim 9, wherein in an extending direction of the flexible substrate, the bendable region has a width which is at least two or more times the largest thickness of the functional chips in the two adjacent chip regions.

11. The flexible substrate of claim 1, wherein the functional chips comprise one or more chip constructed into a single chip, a stacked chip, or a TSV integrated chip.

12. A display device, wherein the display device comprises a peripheral circuit which is encapsulated in a flexible substrate,
    wherein the flexible substrate comprises at least two chip regions in which functional chips are arranged; and
    a bendable region which is arranged between two adjacent chip regions,
    wherein the flexible substrate configured to be bended at the bendable region, and
    wherein in the bended state of the flexible substrate, two chip regions adjacent with the bendable region overlap, and the flexible substrate has a cross-sectional shape of a rectangular spiral.

13. The display device of claim 12, wherein the chip regions are further provided with electrodes to be electrically connected with an external substrate.

14. The display device of claim 12, wherein the flexible substrate comprises wires which are arranged in the bendable region, and the functional chips are connected with one another through the wires.

15. The display device of claim 12, wherein the chip regions have a same shape and a same size.

16. The display device of claim 12, wherein the flexible substrate is only provided with the functional chips on a side of the chip regions, and the functional chips are arranged on different sides of the two adjacent chip regions.

17. The display device of claim 16, wherein in an extending direction of the flexible substrate, the bendable region has a width which is at least equal to or larger than the largest thickness of the functional chips in the two adjacent chip regions.

18. The display device of claim 12, wherein the flexible substrate is only provided with the functional chips on a side of the chip regions, and the functional chips are arranged on a same side of the two adjacent chip regions.

* * * * *